(12) United States Patent
Chaji et al.

(10) Patent No.: US 11,929,010 B2
(45) Date of Patent: Mar. 12, 2024

(54) MICRODEVICE CARTRIDGE MAPPING AND COMPENSATION

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

(*) Notice: Subject to any disclaimer, the term of this patent is extended or adjusted under 35 U.S.C. 154(b) by 0 days.

(21) Appl. No.: 17/600,905

(22) PCT Filed: Apr. 3, 2020

(86) PCT No.: PCT/IB2020/053230
§ 371 (c)(1),
(2) Date: Oct. 1, 2021

(87) PCT Pub. No.: WO2020/202112
PCT Pub. Date: Oct. 8, 2020

(65) Prior Publication Data
US 2022/0157231 A1    May 19, 2022

Related U.S. Application Data

(60) Provisional application No. 62/829,444, filed on Apr. 4, 2019.

(51) Int. Cl.
*G09G 3/32* (2016.01)

(52) U.S. Cl.
CPC ....... *G09G 3/32* (2013.01); *G09G 2320/0233* (2013.01); *G09G 2320/045* (2013.01); *G09G 2320/0673* (2013.01); *G09G 2360/16* (2013.01)

(58) Field of Classification Search
CPC . G06F 3/14; G06F 3/1423–1446; G09G 3/14; G09G 3/32–3291; G09G 2300/02; G09G 2300/026; G09G 2300/0804; G09G 2300/0819; G09G 2310/0243; G09G 2310/0289; G09G 2310/0291; G09G 2310/04; G09G 2310/06; G09G 2310/08; G09G 2320/0233; G09G 2320/0271; G09G 2320/0276; G09G 2320/045; G09G 2320/0666; G09G 2320/0673; G09G 2320/0686; G09G 2320/0693; G09G 2360/14; G09G 2360/145; G09G 2360/147; G09G 2360/16

See application file for complete search history.

(56) References Cited

U.S. PATENT DOCUMENTS

| | | | |
|---|---|---|---|
| 8,896,505 B2 | 11/2014 | Cok et al. | |
| 2005/0134526 A1* | 6/2005 | Willem | G06F 3/1446 345/1.3 |
| 2008/0122832 A1* | 5/2008 | Chen | G09G 3/32 345/55 |

(Continued)

FOREIGN PATENT DOCUMENTS

| | | |
|---|---|---|
| CN | 103646893 A | 3/2014 |
| JP | 2006140398 A | 6/2006 |

OTHER PUBLICATIONS

WIPO: International Search Report and Written Opinion relating to PCT application No. PCT/IB2020/53230, dated Jun. 22, 2020.

(Continued)

*Primary Examiner* — Nathan Danielsen

(57) ABSTRACT

This disclosure is related to compensation of micro devices based on cartridge information.

4 Claims, 3 Drawing Sheets

(56) References Cited

U.S. PATENT DOCUMENTS

| | | |
|---|---|---|
| 2009/0261358 A1 | 10/2009 | Chitnis et al. |
| 2010/0140633 A1* | 6/2010 | Emerson ............ H01L 25/0753 |
| | | 257/E33.056 |
| 2016/0360712 A1* | 12/2016 | Yorio .................... A01G 31/06 |
| 2017/0215280 A1 | 7/2017 | Chaji et al. |
| 2017/0278734 A1 | 9/2017 | Zou et al. |
| 2018/0068884 A1 | 3/2018 | Chaji |
| 2018/0095124 A1 | 4/2018 | Chaji et al. |
| 2018/0295688 A1 | 10/2018 | Hasnain et al. |
| 2019/0096774 A1 | 3/2019 | Chaji |

OTHER PUBLICATIONS

CNIPA: Chinese Office Action relating to CN application No. 201811405946.0, dated Oct. 9, 2022.

* cited by examiner

MICRODEVICE CARTRIDGE MAPPING AND COMPENSATION

CROSS-REFERENCE TO RELATED APPLICATION

This application claims priority to and benefit of U.S. Provisional Patent Application No. 62/829,444, filed Apr. 4, 2019, which is hereby incorporated herein by reference in its entirety.

FIELD OF THE INVENTION

The present disclosure relates to the compensation of micro devices based on cartridge information.

BRIEF SUMMARY

According to one embodiment, a method of populating a system (receiver) substrate with micro devices may be provided. The method comprising arranging microdevices in a cartridge, extracting at least one parameter for at least one of the micro devices in the cartridge; and selecting and arranging the cartridges to populate the system substrate so that the extracted parameter for adjacent cartridges is within a predefined threshold.

According to another embodiment, a method of a system (receiver) substrate micro devices may be provided. The method comprising arranging microdevices in a cartridge; extracting at least a distribution map for one parameter for the micro devices in the cartridge; and selecting and arranging the cartridges to populate the system substrate so that the distribution map for at least one of the parameters forms a continuous map with a step within a defined threshold between the map of the cartridges associated with the corresponding adjacent areas on the system substrate.

According to another embodiment, a method to calculate compensation value for variation in micro-devices transferred from different cartridges into system substrate may be provided. The method comprising using a micro device position to fetch the cartridge parameters; and using the cartridge parameters along with micro device value to calculate the compensation value.

According to yet another embodiment, a compensation method for a micro device in a system substrate may be provided. The method comprising providing different micro devices where at least the output of a micro device different than the micro device is adjusted to compensate for a parameter in said micro device.

BRIEF DESCRIPTION OF THE DRAWINGS

The foregoing and other advantages of the disclosure will become apparent upon reading the following detailed description and upon reference to the drawings.

Figure 1:
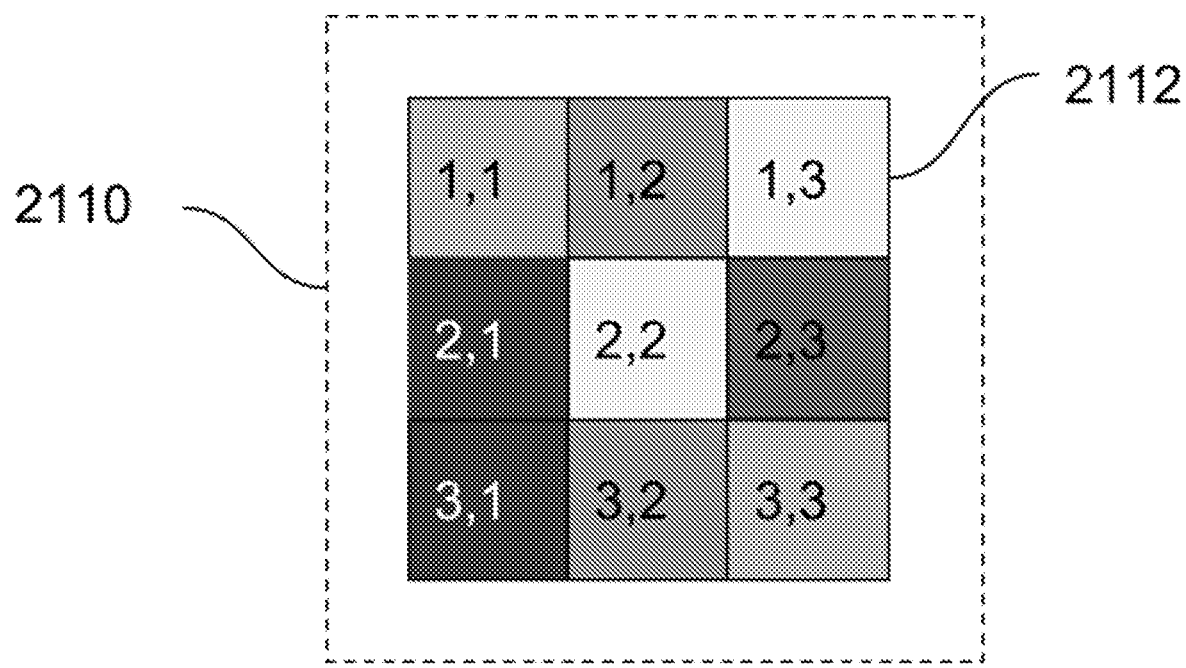
FIG. 1 shows a map of variation between at least one parameter of the device on cartridges associated with adjacent areas on a system substrate.

The present disclosure is susceptible to various modifications and alternative forms, specific embodiments or implementations as have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

In this description, the terms "device" and "micro device" are used interchangeably. However, it is clear to one skilled in the art that the embodiments described here are independent of the device size.

The present invention relates to methods of populating system substrate with micro devices. These methods further relate to considering threshold value of certain parameters values and compensating micro devices compared to adjacent micro devices. Moreover binning is also used to reduce parameter differences between microdevice areas on the system substrate.

FIG. 1 shows a map of variation between at least one parameter of the device on cartridges 2110 associated with adjacent areas 2112 on a system substrate. To reduce the difference between these areas, the cartridges associated with these areas may be binned.

Figure 2:
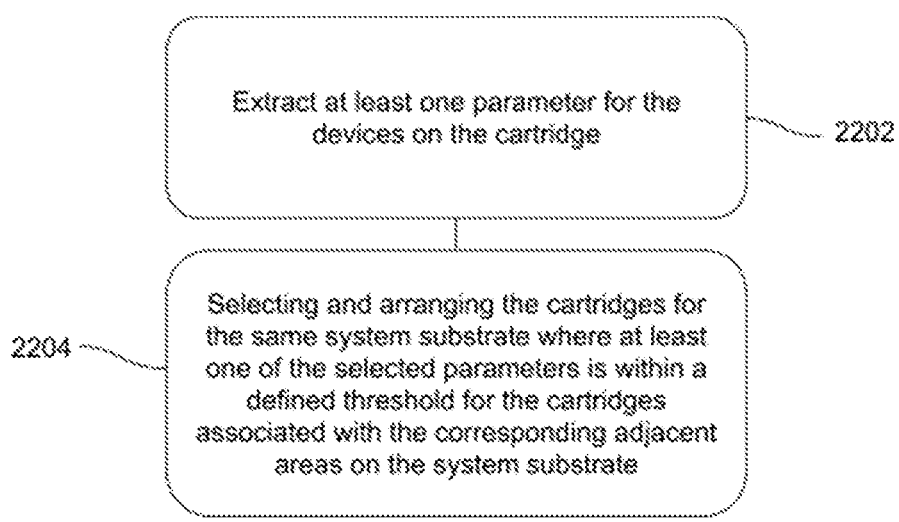
FIG. 2 illustrating steps of binning the adjacent areas of the cartridges.

FIG. 2 illustrating steps of binning the adjacent areas of the cartridges. In first step 2202, the mean or median of at least one of the parameters for the cartridges is calculated. In second step 2204, the cartridges are binned and arranged to fill the adjacent areas in the system substrate so that the mean or median (or any other representation of the measured parameter) of at least one parameter stay within a threshold. In this case, the difference between the at least one parameter (or its representation of the parameter) of the cartridges associated with the adjacent areas stay within a threshold.

Figure 3:
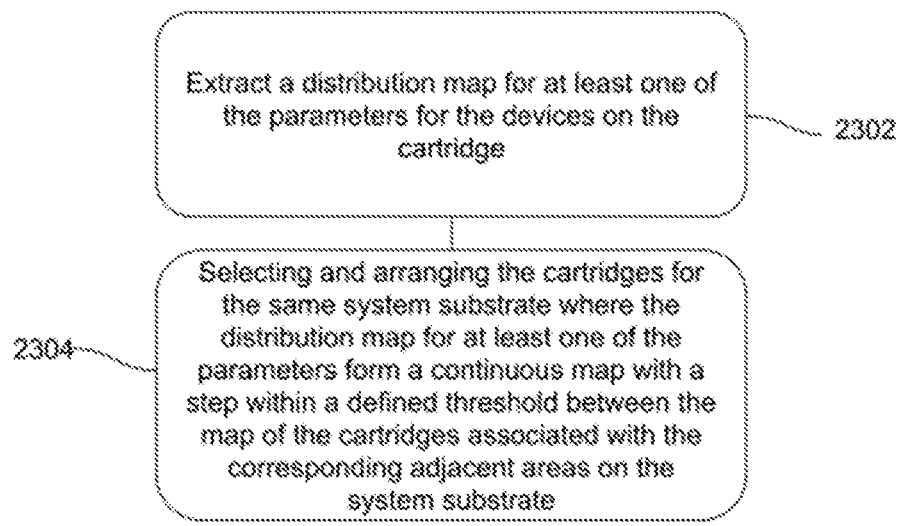
FIG. 3 shows a distribution map for at least one parameter created for the cartridges.

FIG. 3 shows a distribution map for at least one parameter created for the cartridges. Here, at step 2302, a distribution map is extracted for at least one of the parameters for the devices on the cartridge. In second step 2304, the cartridges are binned and arranged to fill the adjacent areas in the system substrate where the step between the map of the cartridges associated with adjacent areas is within a threshold value.

In another case, the combination of the binning processes in FIG. 2 and FIG. 3 can be used.

In another case, the characteristic of the micro devices associated with the adjacent areas is compensated so that the difference between the devices in the different adjacent areas is less than a threshold. In one case, if the parameter is the color point, the other micro devices can be used to adjust the color point of the said micro devices. Here, the data extracted for the cartridge can be used to compensate for the micro devices. In another case, the micro device performance associated with different cartridge can be measured after the transfer to the system substrate.

Figure 4:
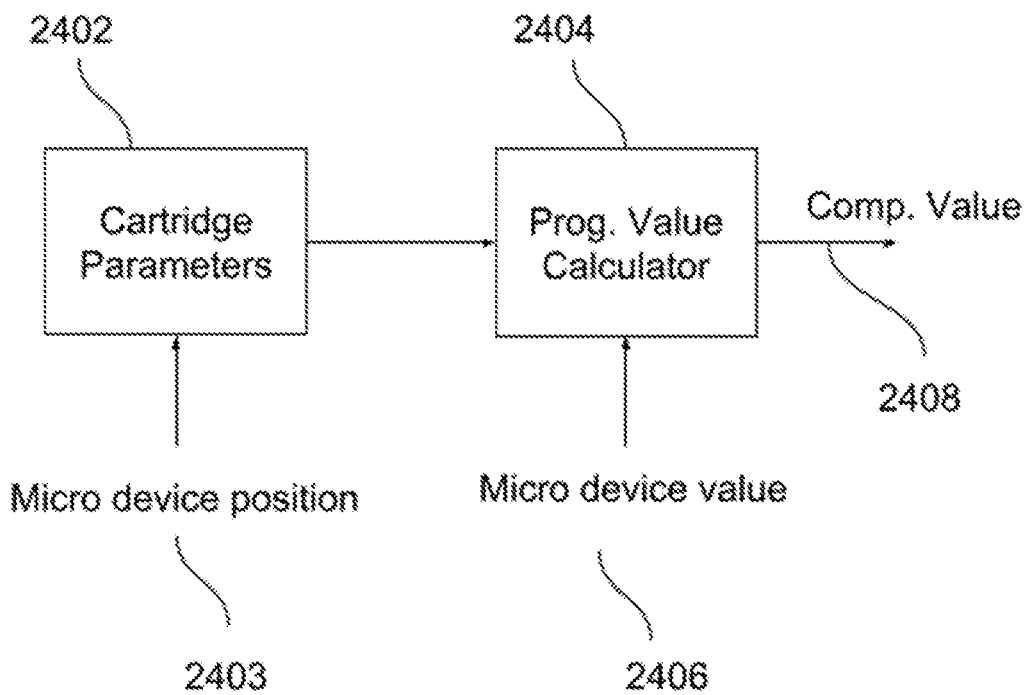
FIG. 4 shows an exemplary block diagram of cartridge parameter compensation.

FIG. 4 shows an exemplary block diagram of cartridge parameter compensation. If different parameters are compensated, few of these blocks can be used either in series or parallel. The first block store 2402 the parameters associated with the cartridges used to populate a system substrate. In addition, the micro device position 2403 is passed to a block 2402 to extract the cartridge parameters associated with the cartridge from which the micro device is extracted. The micro device is passed through a value calculator block 2404 to generate a comp value 2408. The calculator block can be a lookup table or a computation block. Here, the microdevice 2406 value is also passed to value calculator block 2404.

In some cases, the compensation involved using other micro device types. In one example, the color point of a display can be adjusted with using different micro light emitting devices (micro-LED).

Figure 5:
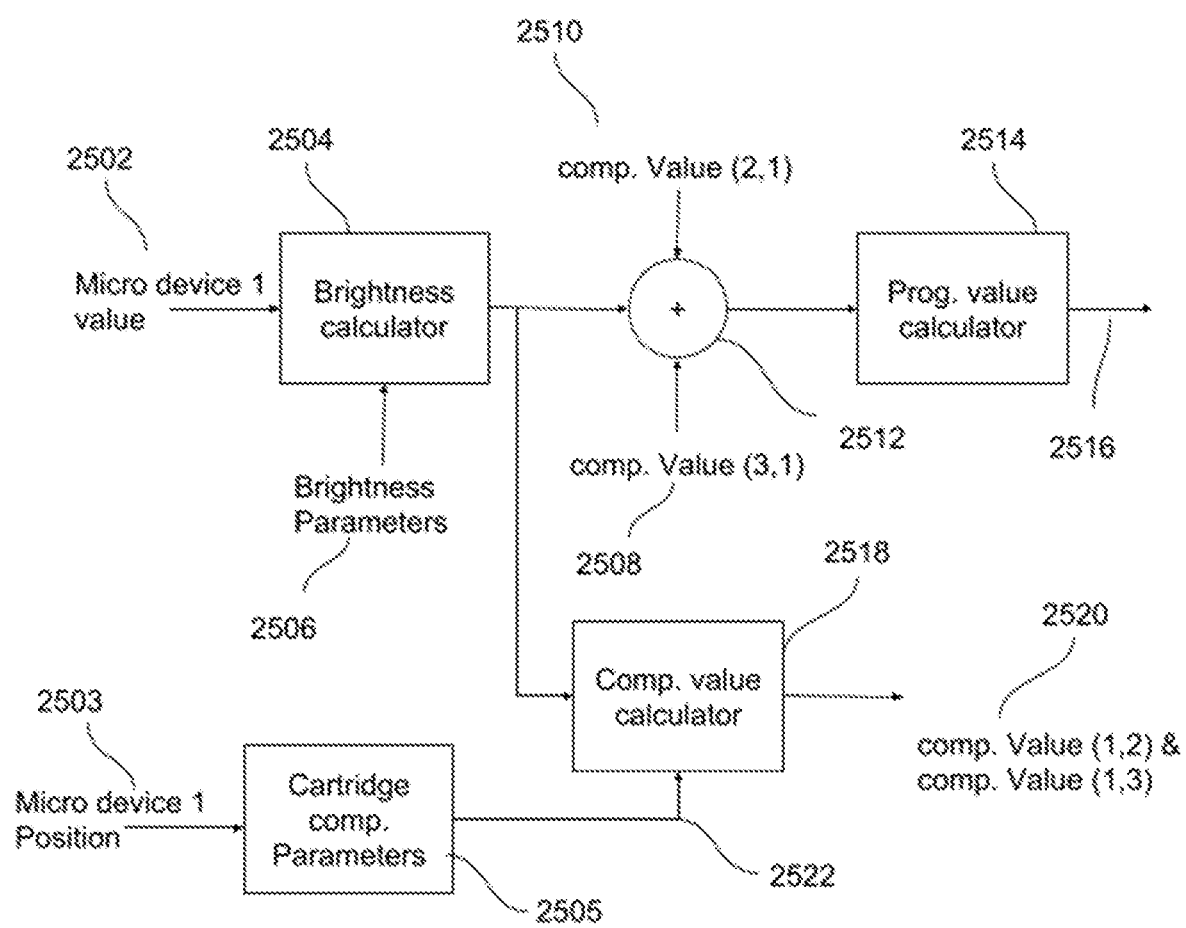
FIG. 5 shows an exemplary implementation of such compensation.

FIG. 5 shows an exemplary implementation of such compensation. Here, the micro device 2502 value is translated into a brightness by brightness calculator 2504 using brightness parameters 2506. Also, the brightness value may be extracted from a gamma curve where the gamma curve shows the intended brightness level for each gray scale. The gamma curve can be normalized by peak brightness to eliminate the dependency to peak brightness.

In addition, the micro device 1 position 2503 is passed to a block 2505 to extract the compensation parameters 2522 associated with the cartridge from which the micro device is extracted. These parameters 2522 are passed to a compensation calculator 2518 along with the micro device brightness value to calculate the compensation values 2520 required from the other devices. The compensation values are in brightness format. The brightness value for the micro device 1 is also combined with the required compensation values 2508, 2510 associated with other micro devices. The combined value 2512 is then passed to a calculator block 2514 to calculate a programming value 2516. In one case, the compensation values 2508, 2510 are added to the brightness of the micro device 1. In this block 2514, other functions such as compensation for micro device 1 non-uniformity, pixel non-uniformity, and gamma adjustment (related to gamma curve of adjacent area) can be covered.

The invention the above described may be varied in many ways. Such variations are not to be regarded as a departure from the scope of the invention, and all such modifications as would be obvious to one skilled in the art are intended to be included within the scope of the following claims.

The invention claimed is:

1. A method of populating a system (receiver) substrate with micro devices, the method comprising:
   binning the micro devices in adjacent areas of a cartridge;
   extracting at least one parameter for at least one of the micro devices in the cartridge; and
   selecting and arranging the cartridges to populate the system substrate so that the parameter extracted for adjacent cartridges is within a predefined threshold.

2. A method of populating a system (receiver) substrate micro devices, the method comprising:
   binning microdevices in adjacent areas of a cartridge;
   extracting at least a distribution map for one parameter for the micro devices in the cartridge; and
   selecting and arranging the cartridges to populate the system substrate so that the distribution map for at least one of the parameters forms a continuous map with a step within a defined threshold between the map of the cartridges associated with the corresponding adjacent areas on the system substrate.

3. A method of populating a system (receiver) substrate with micro devices, the method comprising:
   arranging the micro devices in a cartridge;
   extracting at least one parameter for at least one of the micro devices in the cartridge; and
   selecting and arranging the cartridges to populate the system substrate so that the parameter extracted for adjacent cartridges is within a predefined threshold.

4. A method of populating a system (receiver) substrate micro devices, the method comprising:
   arranging microdevices in a cartridge;
   extracting at least a distribution map for one parameter for the micro devices in the cartridge; and
   selecting and arranging the cartridges to populate the system substrate so that the distribution map for at least one of the parameters forms a continuous map with a step within a defined threshold between the map of the cartridges associated with the corresponding adjacent areas on the system substrate.

* * * * *